Feb. 21, 1967

M. BARLOWE

HEAT DISSIPATOR WITH PIVOTABLE MEANS
TO GRIP A SEMICONDUCTOR DEVICE

Filed Aug. 24, 1965

3,305,004

INVENTOR.
M. BARLOWE

BY
[signature]
AGENT

United States Patent Office 3,305,004 Patented Feb. 21, 1967

3,305,004

HEAT DISSIPATOR WITH PIVOTABLE MEANS TO GRIP A SEMICONDUCTOR DEVICE

Murray Barlowe, Bethpage, N.Y., assignor to North American Philips Co., Inc., New York, N.Y., a corporation of Delaware Filed Aug. 24, 1965, Ser. No. 482,185
9 Claims. (Cl. 165—80)

This invention relates to heat dissipators or heat sinks for semiconductor devices, such as transistors, rectifiers, and diodes.

A principal object of the invention is a semiconductor device heat dissipator which may be manufactured primarily by extrusion.

Another object of the invention is a semiconductor device heat dissipator which may be made primarily by extrusion and is adapted for cooling TO–1 size semiconductor devices and the like.

Still a further object of the invention is a semiconductor device heat dissipator which clamps onto the device at the time the dissipator is mounted onto a chassis or like cold plate.

These and other objects are realized with my novel heat dissipator, which comprises a body of heat-conductive material providing with heat radiating elements, such as radial fins, in the vicinity of at least one hole for mounting the semiconductor device. The body portions adjacent the surface for mounting the dissipator constitutes a wall defining the hole, and a portion of that wall is slotted at the mounting surface. The body is provided with oppositely-extending mounting extensions or flanges by which the body may be clamped to a suitable chassis or the like. At least one of these mounting extensions is angled up slightly with respect to the mounting surface, and the body portions adjacent the hole and generally opposite to the slit are of reduced thickness. As a consequence, when the mounting extension or flanges are bolted or screwed or otherwise tightened down onto the chassis or other suitable cooling plate, the angled flange bends downward reducing the diameter of the device mounting hole sufficiently to clamp the device tightly to the dissipating body.

My invention will now be described in greater detail with respect to an exemplary embodiment thereof, reference being had to the accompanying drawing wherein:

FIG. 4 is a view illustrating the heat dissipator shown in FIG. 1 with two transistors mounted therein clamped to a chassis or the like.

Figure 1:
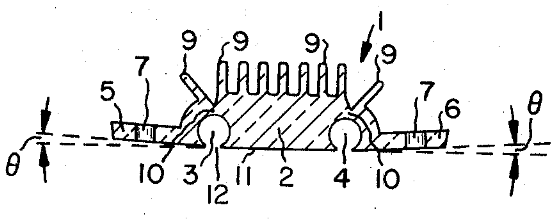
FIG. 1 is a cross-sectional view of my novel heat dissipator taken along its longitudinal dimension.
Figure 3:
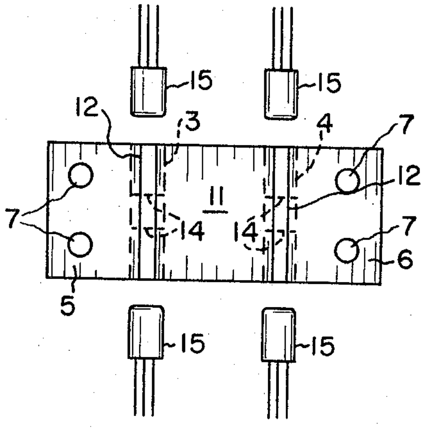
FIG. 3 is a bottom view of the heat dissipator shown in FIG. 1, and also illustrating four transistors ready for mounting within the heat dissipator.
Figure 2:
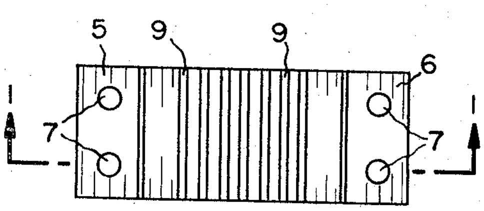
FIG. 2 is a top view of the heat dissipator shown in FIG. 1.

Referring now to the drawing, FIGS. 1, 2 and 3 show respectively, cross-sectional, top and bottom views of one form of my novel dissipator. It comprises an integral body 1 of heat-conducting material, such as aluminum or copper. The heat dissipator comprises a central body portion 2 containing, in the form shown, two holes or openings 3, 4 for receiving the semiconductor devices. On opposite sides of the mounting holes 3, 4 and extending outwardly are flanges 5, 6 for fastening the dissipator to a chassis, cooling plate or like heat sink. For this purpose, holes 7 are provided in the flanges for receiving the usual screw or bolt. From the upper part of the body extends a plurality of heat-radiating elements 9 which in the form shown are radial fins. As will be apparent from the drawing, the body regions 10 adjacent the holes 3, 4 and lying between the two end fins are of reduced thickness, and thus represent a weakened area at which bending will take place as the adjacent flange is pivoted. The bottom surface 11 of the body is the surface which engages the chassis or cooling plate and is referred to as the mounting surface of the dissipator. The body portions at the bottom of the mounting holes 3, 4 at the mounting surface 11 have been removed to form slots 12 exposing the mounting holes 3 and 4. The flanges 5 and 6, as will be observed, do not extend in the same plane as the bottom surface of the center region 2 but are angled up slightly to form angles $\theta$ with the bottom surface 11 of the center region. The inclination of these flanges may vary from approximately 3°–12°, though I prefer a range of approximately 6°–8°.

The dissipator shown may be used to cool anywhere from one to four semiconductor devices. As is illustrated in FIG. 3, four TO–1 size transistors 15 are shown each located opposite an end of the mounting holes 3 and 4. By inserting the transistors 15 sideways into the mounting holes to the positions indicated by the dotted lines 14, substantially their entire housings fit comfortably within the body of the dissipator. It will be understood that by slicing the dissipator shown in half along a line extending through the mounting holes 7, then a dissipator results which will accommodate two semiconductor devices only. Similarly, it will be clearly evident that it is possible to accommodate a single device by shifting the mounting hole 3 to the center and eliminating the other mounting hole 4.

As will be evident from the cross-sectional view of FIG. 1, the dissipator of the invention is readily made by extrusion, and a number of such devices have been successfully manufactured out of aluminum by this technique, the width of the device, which depends upon the number of semiconductor devices to be accommodated, being determined by simply slicing transversely a common extrusion to the desired size. The only other manufacturing operation required is to drill or punch the mounting holes 7, though it is also possible to provide clamps on the chassis for engaging the flange portions 5 and 6.

Figure 4:
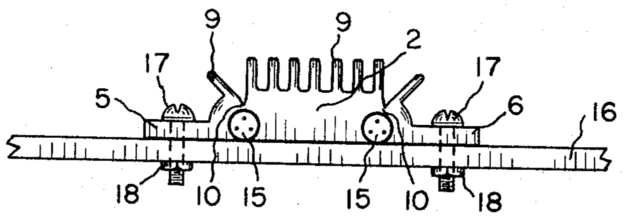

One of the features of the invention is that the mounting holes 3 and 4 are made slightly oversized, of the order of 5–10 thousandths of an inch. This is to insure that the conventional TO–1 size device will readily fit the hole, taking into account the normal tolerances available with common extrusions and also the normal tolerances available with typical semiconductor devices. The typical TO–1 device has a diameter of 0.240″ and a length 0.410″, with three leads extending out from the base. The transistors 15 are positioned in the oversized mounting openings 3, 4 and then the dissipator 1 is bolted to the usual chassis or the like 16, as shown in FIG. 4, by means of screws 17 and nuts 18. In the process of fastening the dissipator to the chassis, the flanges pivot downward through the angle $\theta$ around a pivot point represented by the weakened walls of reduced thickness 10 to end up coplanar with the center region 2, which will result in reducing the size or diameter of the mounting openings 3, 4 sufficiently to tighten down onto and thus clamp the semiconductor devices tightly within the dissipator body. For example, for a dissipator as shown with a length of 2½″ and with a spacing from the center of each mounting hole to the tip of the adjacent flange of ¾″, the diameter of the opening is reduced by approximately 20 thousandths of an inch. As a result, the transistors 15 during the mounting operation become tightly clamped in the dissipator, which in turn is tightly clamped to the chassis or cooling plate. As will be noted, the longitudinal axes of the semiconductor devices are transverse to the longitudinal axis of the dissipator and also parallel to the mounting surface.

The construction shown provides a very low thermal resistance from the semiconductor device case to free air or the chassis or heat sink. The feature of reducing the size of the mounting openings when the dissipator is fastened to the chassis thus taking up the normal tolerances in the typical devices and in the extrusion allows such dissipators to be employed with these tiny TO–1 and similar sized devices. As a consequence, it is now possible to operate these standard devices at temperatures much below the temperature that they would operate at without the heat dissipator, or for the same case temperature at power levels considerably higher, which thus greatly enlarges the areas of application of these devices. For example, for a typical TO–1 device, the 2N2431, the thermal resistance of the case to an infinite heat sink was reduced by a factor of 3 or 4 compared with that of a popular prior art dissipator, which is similar to a fused clip type of sink. As is well known in the art, reduction of the operating temperature generally increases the lifetime of the device and also reduces the spread of the device characteristics and maintains low such characteristics as collector cut-off current, rise time, etc. A further advantage of the dissipator of the invention is that it can be attached to or mounted on a printed board assembly, desirably at the supporting bracket, and will increase the dissipation to free air. In other words, the support for the dissipator need not be a heat sink.

While I have described my invention in connection with specific embodiments and applications, other modifications thereof will be readily apparent to those skilled in this art without departing from the spirit and scope of the invention as defined in the appended claims.

What is claimed is:

1. A heat dissipator for a semiconductor device comprising a body of heat-conductive material having a mounting flange extending out from the side for fastening the heat dissipator along a bottom mounting surface to a suitable support or the like, a hole in said dissipator body for receiving a semiconductor device, said flange being inclined upwardly at a small angle with respect to the main body of the dissipator, and means for closing down the hole when the dissipator is fastened to said support thereby bending the mounting flange for clamping a device therein in good heat conducting relationship.

2. A heat dissipator as set forth in claim 1 and constituted of aluminum.

3. A heat dissipator for a semiconductor device comprising a body of heat-conductive material comprising a center region having heat-radiating elements extending from an upper surface thereof and a pair of mounting flanges extending out from the side for fastening the heat dissipator along a bottom mounting surface to a suitable chassis or the like, a hole in said dissipator body for receiving a semiconductor device, said hole opening at the bottom mounting surface, at least one of said flanges being inclined upwardly at a small angle with respect to the main body of the dissipator, a wall portion adjacent the device-receiving hole being of reduced thickness, whereby fastening of the dissipator to said chassis pivots the mounting flange about the region of reduced wall thickness closing down the device-receiving hole for clamping a device therein in good heat conducting relationship.

4. A dissipator as set forth in claim 3 wherein the flange inclines upwardly at an angle between about 3° and 10°.

5. A dissipator as set forth in claim 3 wherein the flange inclines upwardly at an angle between about 6° and 8°.

6. A heat dissipator for a semiconductor device comprising an extruded body of heat-conductive material having a longitudinal axis transverse to the extrusion direction and comprising a center region having heat-radiating radial fins extending transverse to the longitudinal axis from an upper surface thereof and a pair of mounting flanges extending out from opposite sides for fastening the heat dissipator along a bottom mounting surface to a suitable heat sink or the like, a hole opening onto the mounting surface in said dissipator body for receiving a semiconductor device, said hole extending generally parallel to the said mounting surface and to the radial fins, at least one of said flanges being inclined upwardly at a small angle of about 6°–8° with respect to the main body of the dissipator, the wall portions adjacent the device-receiving hole and generally opposite the mounting surface being of reduced thickness, whereby fastening of the dissipator to said heat sink pivots the mounting flange about the region of reduced wall thickness closing down the device-receiving hole for clamping a device therein in good heat conducting relationship.

7. A dissipator as set forth in claim 6 wherein the center region contains a pair of holes between the flanges, and both flanges are inclined upwardly.

8. A dissipator as set forth in claim 7 wherein the region of reduced wall thickness lies between the two end fins.

9. A dissipator, substantially as shown in FIGS. 1, 2 and 3.

References Cited by the Examiner

UNITED STATES PATENTS

| | | | |
|---|---|---|---|
| 2,863,974 | 12/1958 | Zabel et al. | 317—100 X |
| 3,101,114 | 8/1963 | Katz | 165—80 X |
| 3,137,342 | 6/1964 | Katz | 165—80 |
| 3,200,296 | 8/1965 | Bruestle | 165—80 X |

MEYER PERLIN, *Primary Examiner.*

A. W. DAVIS, *Assistant Examiner.*